(12) United States Patent
Jewett et al.

(10) Patent No.: US 9,005,363 B2
(45) Date of Patent: Apr. 14, 2015

(54) CRYSTALLINE FILM DEVICES, APPARATUSES FOR AND METHODS OF FABRICATION

(71) Applicants: Russell F Jewett, Charlotte, NC (US); Steven F Pugh, Charlotte, NC (US); Paul Wickboldt, Walnut Creek, CA (US)

(72) Inventors: Russell F Jewett, Charlotte, NC (US); Steven F Pugh, Charlotte, NC (US); Paul Wickboldt, Walnut Creek, CA (US)

(73) Assignee: Sencera Energy, Inc., Charlotte, NC (US)

( * ) Notice: Subject to any disclaimer, the term of this patent is extended or adjusted under 35 U.S.C. 154(b) by 0 days.

(21) Appl. No.: 13/743,807

(22) Filed: Jan. 17, 2013

(65) Prior Publication Data

US 2013/0196081 A1    Aug. 1, 2013

Related U.S. Application Data

(62) Division of application No. 12/111,126, filed on Apr. 28, 2008, now Pat. No. 8,357,242.

(51) Int. Cl.

| | | |
|---|---|---|
| C30B 23/00 | (2006.01) | |
| C30B 25/00 | (2006.01) | |
| C30B 28/12 | (2006.01) | |
| C30B 28/14 | (2006.01) | |
| C23C 16/505 | (2006.01) | |
| C23C 16/507 | (2006.01) | |
| C30B 25/10 | (2006.01) | |
| C30B 29/06 | (2006.01) | |
| H01J 37/32 | (2006.01) | |

(Continued)

(52) U.S. Cl.
CPC .............. *C23C 16/505* (2013.01); *C23C 16/507* (2013.01); *C30B 25/105* (2013.01); *C30B 29/06* (2013.01); *H01J 37/321* (2013.01); *H01J 37/32174* (2013.01); *H01L 21/02422* (2013.01); *H01L 21/02532* (2013.01); *H01L 21/02554* (2013.01); *H01L 21/02595* (2013.01); *H01L 21/0262* (2013.01); *C23C 16/24* (2013.01)

(58) Field of Classification Search
USPC .......................................... 117/88, 84, 92, 94
See application file for complete search history.

(56) References Cited

U.S. PATENT DOCUMENTS

| | | |
|---|---|---|
| 4,431,901 A | 2/1984 | Hull |
| 4,859,908 A | 8/1989 | Yoshida et al. |

(Continued)

FOREIGN PATENT DOCUMENTS

| | | |
|---|---|---|
| WO | WO 00/40771 | 7/2000 |
| WO | WO 2008/137433 A1 | 11/2008 |

OTHER PUBLICATIONS

Optical properties of tantalum oxide films produced by high density plasma enhanced chemical vapor deposition, John Caughman, et.al., Oak Ridge National Laboratory, 47th AVS National Symposium, (Oct. 3, 2000).

(Continued)

*Primary Examiner* — James McDonough
(74) *Attorney, Agent, or Firm* — Larry Williams; Williams IPS

(57) ABSTRACT

Methods of depositing thin film materials having crystalline content are provided. The methods use plasma enhanced chemical vapor deposition. According to one embodiment of the present invention, microcrystalline silicon films are obtained. According to a second embodiment of the present invention, crystalline films of zinc oxide are obtained. According to a third embodiment of the present invention, crystalline films of iron oxide are obtained.

18 Claims, 9 Drawing Sheets

(51) Int. Cl.
*H01L 21/02* (2006.01)
*C23C 16/24* (2006.01)

(56) References Cited

U.S. PATENT DOCUMENTS

| | | | |
|---|---|---|---|
| 5,133,986 | A | 7/1992 | Blum et al. |
| 5,891,349 | A | 4/1999 | Tobe et al. |
| 5,908,565 | A | 6/1999 | Morita et al. |
| 6,087,778 | A | 7/2000 | Benjamin et al. |
| 6,093,660 | A * | 7/2000 | Jang et al. ............ 438/763 |
| 6,169,013 | B1 | 1/2001 | Voutsas |
| 6,410,880 | B1 | 6/2002 | Putvinski et al. |
| 6,447,637 | B1 | 9/2002 | Todorov et al. |
| 6,558,504 | B1 | 5/2003 | Markunas et al. |
| 6,586,349 | B1 | 7/2003 | Joen et al. |
| 6,692,622 | B1 | 2/2004 | Colpo et al. |
| 6,815,899 | B2 * | 11/2004 | Choi ................. 315/111.21 |
| 6,855,906 | B2 | 2/2005 | Brailove |
| 6,919,107 | B2 * | 7/2005 | Schwarzenbach et al. ... 427/569 |
| 7,186,663 | B2 * | 3/2007 | Joshi et al. ............ 438/758 |
| 8,357,242 | B2 * | 1/2013 | Jewett et al. ............ 117/88 |
| 2001/0006070 | A1 | 7/2001 | Shang et al. |
| 2001/0019903 | A1 | 9/2001 | Shufflebotham et al. |
| 2002/0132452 | A1 | 9/2002 | Oka et al. |
| 2002/0197402 | A1 | 12/2002 | Chiang et al. |
| 2003/0047536 | A1 | 3/2003 | Johnson |
| 2004/0253759 | A1 | 12/2004 | Garber et al. |
| 2005/0194099 | A1 | 9/2005 | Jewett, Jr. et al. |
| 2005/0202653 | A1 | 9/2005 | Joshi et al. |

OTHER PUBLICATIONS

Room Temperature Growth of Indium-Tin Oxide on Organic Flexible Polymer Substrates Using a New Reactive-Sputter Deposition Technology, Jose V. Anguita, et al., *Plasma Processes and Polymers*, vol. 4, Issue 1 (Jan. 2007).

International Search Report and Written Opinion of International Searching Authority, International Application No. PCT/US2008/61923, Filing date Apr. 29, 2008.

USPTO Office Action U.S. Appl. No. 12/141,071, dated Jul. 19, 2011.

* cited by examiner

CRYSTALLINE FILM DEVICES, APPARATUSES FOR AND METHODS OF FABRICATION

CROSS REFERENCES

The present application is a divisional of U.S. patent application Ser. No. 12/111,126, filed Apr. 28, 2008 (projected to be issued U.S. Pat. No. 8,357,242), which claims benefit of U.S. Patent Application Ser. No. 60/927,679, filed May 3, 2007, inventors Russell F. Jewett, Steven F. Pugh, and Paul Wickboldt, entitled "CRYSTALLINE FILM DEVICES, APPARATUSES FOR AND METHODS OF FABRICATION." The present application is related to U.S. Patent Application Ser. No. 60/936,204, filed Jun. 18, 2007, inventors Jewett, Pugh, and Wickboldt; U.S. patent application Ser. No. 10/792,462, filed Mar. 3, 2004, inventors Jewett and Scholl. The contents of U.S. Patent Application Ser. No. 60/927,679, U.S. Patent Application Ser. No. 60/936,204, and U.S. patent application Ser. No. 10/792,462 are incorporated herein, in its entirety, by this reference.

TECHNICAL FIELD

This invention relates to manufacturing materials such as thin films using vacuum plasma chemical vapor deposition (CVD) methods, and more particularly to nanocrystalline, microcrystalline, polycrystalline, or crystalline thin films used in electronics applications such as solar cells, flat panel displays, thin film transistors, and integrated circuits. For this disclosure, the terms "nanocrystalline," "microcrystalline," "polycrystalline" and "crystalline" are defined as materials having a measurable amount of crystalline content. The terms "nanocrystalline," "microcrystalline," "polycrystalline" and "crystalline" are referred to in this disclosure as "material with crystalline content."

BACKGROUND

There are many applications in which thin films are desired which have a crystalline content, either being entirely composed of a crystalline phase, or contain a mixture of crystalline phase and other phases, such as an amorphous phase. Several examples of such films follow.

For example, one application is silicon thin film solar cells. There has been much research concerning the use of microcrystalline (sometimes referred to as nanocrystalline or polycrystalline) silicon thin films as a candidate absorber layer in thin film photovoltaic cells. Microcrystalline silicon thin films are generally a mixed phase silicon film containing both small grain silicon crystals and amorphous phase silicon. Solar cells fabricated from this material have shown very promising results in terms of energy conversion efficiency; consequently, a method to fabricate them at an economic rate is strongly desired.

Another example is thin film transparent electrically conductive oxides (TCOs), such as indium tin oxide (ITO) and such as zinc oxide (ZnO). These materials are extensively used in flat panel displays, touch screens, and solar cells. It is strongly desired that TCOs have the highest possible electrical conductivity, which can be achieved by increasing the mobility of the electron and/or hole carriers of these materials. The mobility of these carriers is limited, in part, by the crystalline phase and microstructure of the films. The crystalline phase has a much higher mobility than the amorphous phase, and the mobility of the crystalline phase increases with the size of the crystal grains.

SUMMARY

This invention provides methods, apparatuses, and/or systems that overcome one or more problems related to the fabrication of devices that require a material with crystalline content.

It is to be understood that the invention is not limited in its application to the details of construction and to the arrangements of the components set forth in the following description or illustrated in the drawings. The invention is capable of other embodiments and of being practiced and carried out in various ways. In addition, it is to be understood that the phraseology and terminology employed herein are for the purpose of description and should not be regarded as limiting.

As such, those skilled in the art will appreciate that the conception, upon which this disclosure is based, may readily be utilized as a basis for the designing of other structures, methods, and systems for carrying out aspects of the present invention. It is important, therefore, that the claims be regarded as including such equivalent constructions insofar as they do not depart from the spirit and scope of the present invention.

The above and still further features and advantages of the present invention will become apparent upon consideration of the following detailed descriptions of specific embodiments thereof, especially when taken in conjunction with the accompanying drawings.

Figure 1:
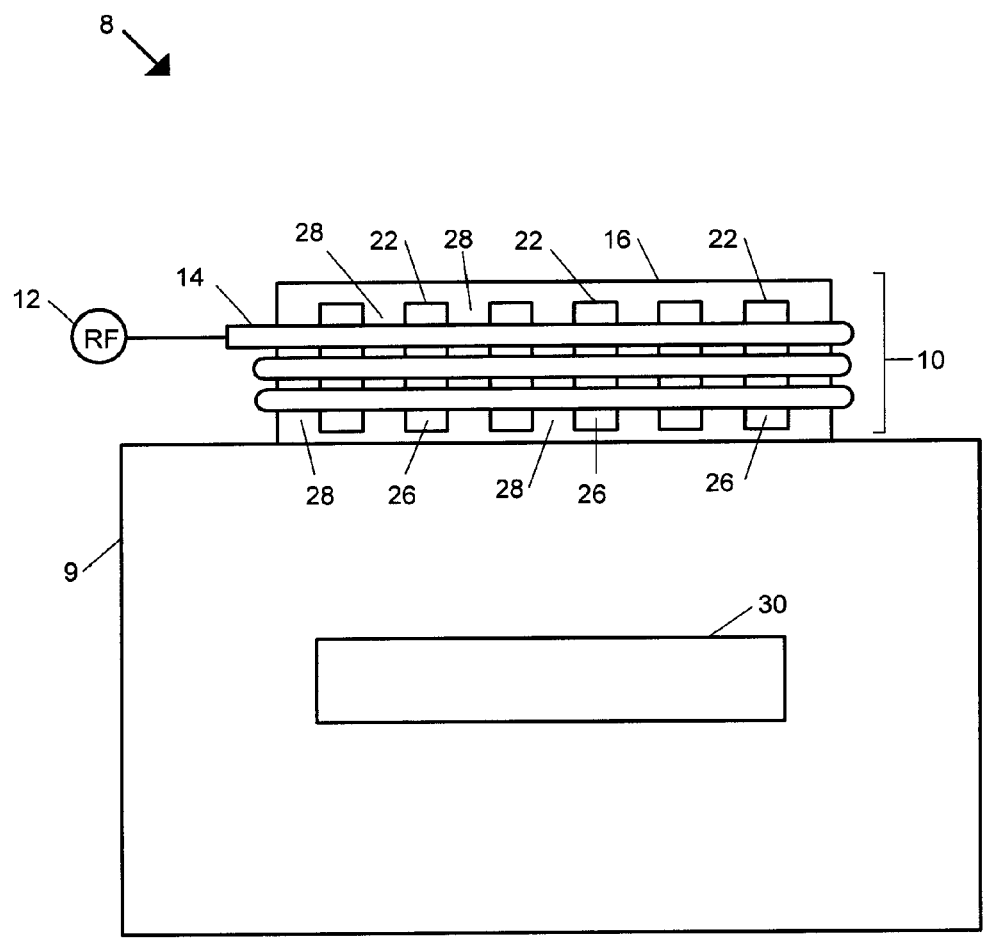
FIG. 1 shows an embodiment of the present invention.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DESCRIPTION

The present invention pertains to the deposition of materials with crystalline content used for devices such as optical devices, electronic devices, optoelectronic devices, and energy conversion devices such as photovoltaic cells and photoelectrochemical cells. The operation of embodiments of the present invention will be discussed below, primarily, in the context of deposition of silicon having crystalline content for applications such as photovoltaic cells, such as flat panel displays, such as thin film transistors, and such as integrated circuits. However, it is to be understood that embodiments of the present invention are not to be limited to the deposition of silicon or other materials disclosed herein. Embodiments of the present invention can also be applied to other material systems where there is a need for obtaining crystalline or microcrystalline films at reduced temperatures and/or higher deposition rates.

For microcrystalline silicon deposition, the body of work on alternative fabrication approaches has led to an empirical understanding of the plasma conditions for plasma enhanced chemical vapor deposition (PECVD) which can lead to increased growth rate or enhancement of the crystalline phase. Several plasma conditions tend to improve the growth of the crystal phase: 1) increased dissociation of hydrogen sources or increased density of atomic hydrogen, and 2) decreased ion bombardment at the growing surface. The actual role of hydrogen in promoting crystal growth of silicon is the subject of ongoing research, but it is generally understood that the ion bombardment retards the growth of the crystal phase, and favors the amorphous phase as the ions "amorphize" the near surface regime. This effect of ion bombardment has also been empirically inferred in work on other microcrystalline films such as transparent conductive oxides.

Until the present invention and related discoveries, there was no equipment or methods capable of achieving the desired plasma conditions for fabrication of microcrystalline silicon for commercial operations. The standard technology equipment and methods have limitations which inhibit commercial production of microcrystalline films. These limitations include low film growth rates, lack of uniformity over large areas, powder formation, need for large gas flows and high temperatures. The present invention has none of these limitations while simultaneously providing the desired plasma conditions of high plasma density, high hydrogen dissociation (for silicon deposition), and low ion bombardment. This has led to high growth rate of microcrystalline silicon without the typical limitations for commercialization.

One embodiment of the present invention is a process that includes depositing materials with crystalline content, such as silicon films, using process conditions that produce very high plasma densities while limiting the ion bombardment of the growing film to near the physically lowest limits. The equipment and process conditions, according to embodiments of the present invention, enhance the rate of crystal growth and enhance the crystalline content in the various films which are grown, allowing either higher rates of growth or lower fabrication temperatures or both for the desired films.

Embodiments of the present invention use an inductively coupled plasma source which incorporates an electrostatic shield. An example of this type of inductively coupled plasma source is described in U.S. application Ser. No. 10/792,462, the contents of which are incorporated herein by this reference. The plasma source used for the experimental results presented in this disclosure comprises an inductive coil or antenna, which generates an RF magnetic field that couples inductively to the plasma and a plasma chamber. The plasma chamber includes a grounded electrostatic shield disposed between the coil and plasma. The electrostatic shield has openings, breaks, or slots through which a RF magnetic field passes. According to a preferred embodiment of the present invention, the plasma chamber comprises an electrically conductive metal housing configured to operate as the electrostatic shield. In an alternative embodiment, the plasma chamber may comprise a dielectric housing used with a grounded electrostatic shield.

Without the electrostatic shielding, the RF electric fields of the coil would couple capacitively to the plasma, resulting in increased sheath voltages between the plasma and all other surfaces exposed to the plasma. The higher sheath voltages also increase the ion bombardment energy. In embodiments of the current invention, the electrostatic shield blocks, or greatly reduces, this capacitive coupling to the plasma and reduces the resulting ion bombardment. Using embodiments of the present invention, the plasma is powered to very high densities without the typically observed increases in ion bombardment.

Figure 2:
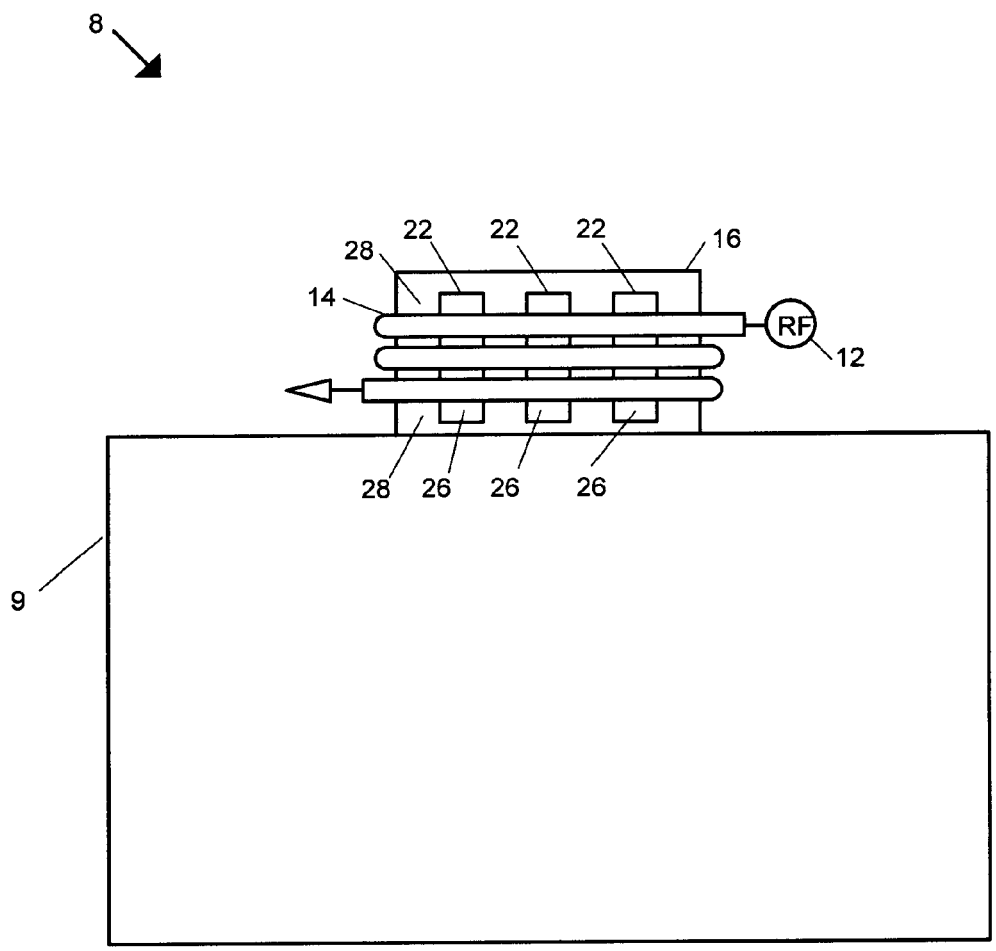
FIG. 2 shows an embodiment of the present invention.

Reference is now made to FIG. 1 and FIG. 2 where there is shown a system 8 (front view and side view, respectively) in accordance with one embodiment of the present invention. System 8 includes a process chamber 9 having substantially conductive metal walls and an inductively coupled plasma source 10. An RF power source 12 furnishes alternating current to induction coils 14 disposed coaxially about a substantially metallic plasma discharge chamber 16 containing a plasma within. As illustrated in the embodiment of FIG. 1, plasma source 10 is configured as a vacuum chamber with an opening in one side for exhaust. Process chamber 9 and plasma source 10 are coupled so that the opening for the exhaust from plasma source 10 feeds into process chamber 9. FIG. 1 shows a front view of system 8 having a port 30 for transporting a substrate in or out of process chamber 9.

Plasma source 10 also has metered inlet ports for feed and processing gases (inlet gas ports not shown in FIG. 1). Although not shown, the apparatus may also comprise impedance matching elements or circuitry disposed between RF power source 12 and induction coils 14, as well as measurement and feedback circuitry to regulate operation of the device. Also not shown are other features that may typically be included in a plasma processing system such as vacuum pumping manifolds, gas delivery connections or manifolds, fluid cooling apparatus, plasma ignition electrodes or other devices, and mechanisms for workpiece mounting and/or transport, or electrical biasing.

For the embodiment shown in FIG. 1, plasma discharge chamber 16 is formed of a metal body having longitudinal openings 22 through the side walls of the body. A gastight dielectric seal comprising a gas seal (not shown) and dielectric cover 26 is disposed across each of the openings 22 in order to preserve the gas confinement integrity of plasma discharge chamber 16. The longitudinal openings 22 thus divide the walls of plasma discharge chamber 16 into longitudinally aligned conductive segments 28 interrupted by dielectric breaks.

Alternating current applied to induction coils 14 cause time-varying magnetic fields to develop in the space occupied by the chamber 16. Conductive chamber segments 28 are of a thickness that is greater than the RF skin depth as determined by the material properties of the segments 28 and the operating frequency of the RF power source 12. Eddy currents thus develop that circulate along the surfaces of each conductive chamber segment 28 in a direction that is generally parallel to that of the antenna. As a result, a virtual current loop is established along the interior conductive surfaces of the chamber 16. The virtual current loop further creates time-varying magnetic fields in the interior plasma containment portion of chamber 16, inducing currents within, and thereby coupling power into the plasma.

Only one dielectric gap 22 need be provided in order to create the eddy currents within the conductive chamber body needed to couple power into the plasma within. In principle, the chamber may be comprised of any number of conductive segments 28 separated by dielectric gaps 22, provided that the resulting segments are of sufficiently substantial dimension to carry the required eddy currents and create the virtual current loop. The conductive segments 28 may be comprised of a common structural metal such as aluminum or stainless steel, or any other conductive material suitable to the thermal and chemical environments of a particular plasma processing application. Preferably, each conductive segment 28 is also sufficiently substantial to have embedded within it one or more cooling channels through which cooling fluids may circulate, while retaining such structural properties as may be required of the segment. Dielectric gaps 22 need only be of sufficient width and dielectric strength to resist the peak-to-peak breakdown voltages that develop across the dielectric 26 upon application of RF power to the induction coil 14.

By transferring the RF power furnished to induction coil 14 into a virtual current loop within the plasma chamber, the electromagnetic fields applied to the plasma are concentrated and the coupling of power to the plasma is improved. Due also to the enhanced durability and thermal properties of a nearly all-metal plasma chamber, significantly greater power densities can be realized with a plasma source of the invention as compared with a conventional apparatus of similar scale. Furthermore, the increased power density produces a greater ion density in the plasma substantially without increased ion bombardment energy.

Figure 3:
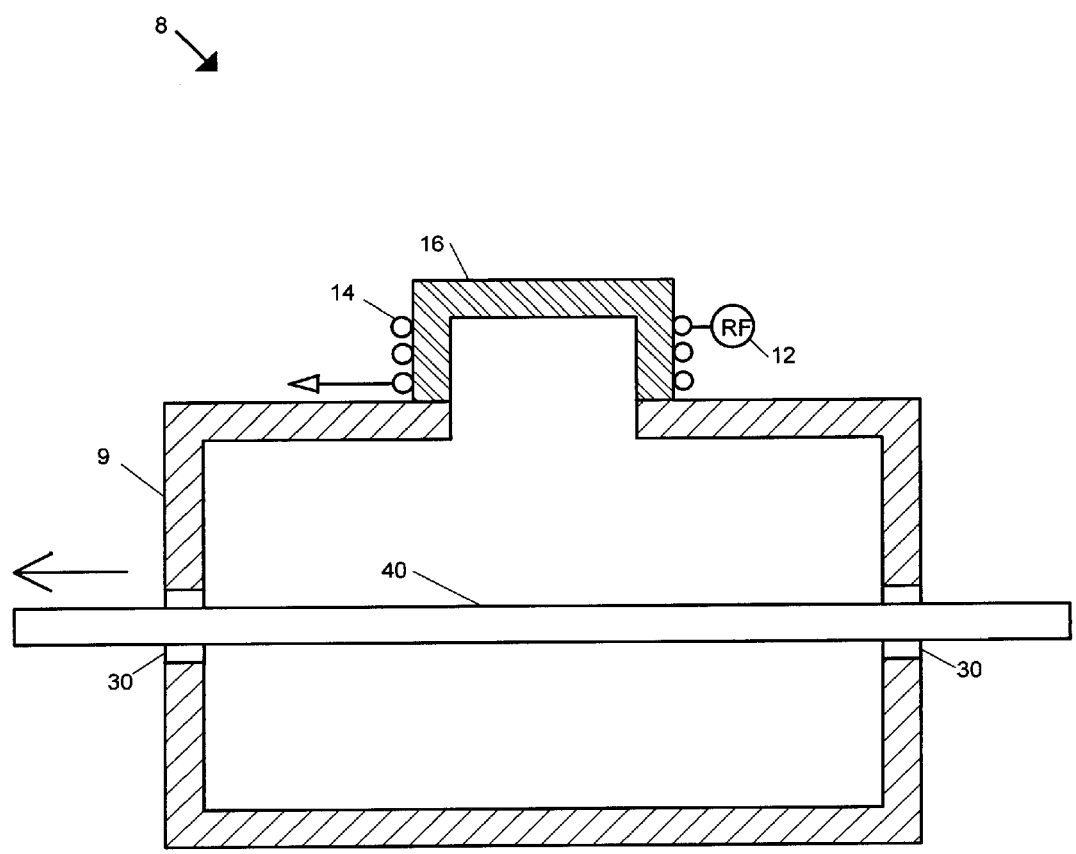
FIG. 3 shows an embodiment of the present invention.

Reference is now made to FIG. 3 where there is shown a cross-sectional side view of system 8 shown in FIG. 2. System 8, shown in FIG. 3, is essentially the same as that shown in FIG. 2 with the exceptions of further illustrating port 30 at the front and back of system 8 and illustrating a substrate 40 passing through process chamber 9 through port 30. FIG. 3 also shows that the width of the plasma chamber is significantly smaller than the length of the plasma chamber which provides the linear source geometry. For preferred embodiments of the present invention, substrate 40 moves perpendicular to the length dimension of the plasma source during processing.

The lowest temperature depositions for the experiments disclosed herein have been achieved without independent heating of the substrate. This means that the only heating of the substrate is that which results from exposure to the plasma. In one experiment to get temperature data, a sheet of polyethylene terephathalate (PET) plastic was suspended in the vacuum with no contact or cooling, and exposed to Argon plasma with over 8 KW of power. After five minutes, the plastic showed no sign of damage. In a second experiment temperature sensitive waxes verified that the plastic temperature did not exceed 80° C.

Preferred embodiments of the present invention use a linear plasma source with a translating, i.e., moving, substrate. For such preferred embodiments, the deposition rate may be presented here using terms such as nm*(m/min), where the m/min is the speed of the moving substrate.

Embodiments of the present invention have been shown to produce unexpected results for growing films with high crystalline content while also achieving high growth rates at low temperatures. More specifically, the crystalline quality of the films and the high growth rates achieved at low to moderate temperatures were never achieved in a system suitable for commercialization before the embodiments of the present invention. Furthermore, embodiments of the present invention can include hardware geometries adaptable for deposition of high-quality films onto large area substrates. In a preferred embodiment of the present invention, the process and apparatus are configured for depositing films on translating substrates. Typical substrate speeds used for the experimental data presented in this application was between about 2 to 5 mm/sec. Embodiments of the present invention can also be practiced using substantially flexible substrates and a reel-to-reel moving substrate configuration.

Figure 4A:
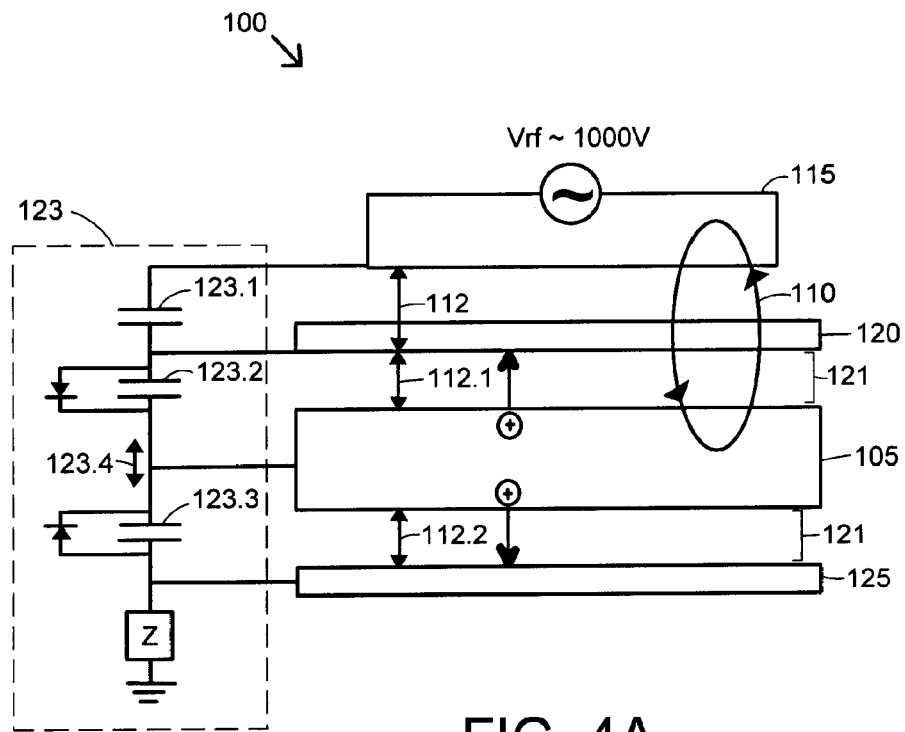
FIG. 4A shows a conventional inductively coupled plasma.
Figure 4B:
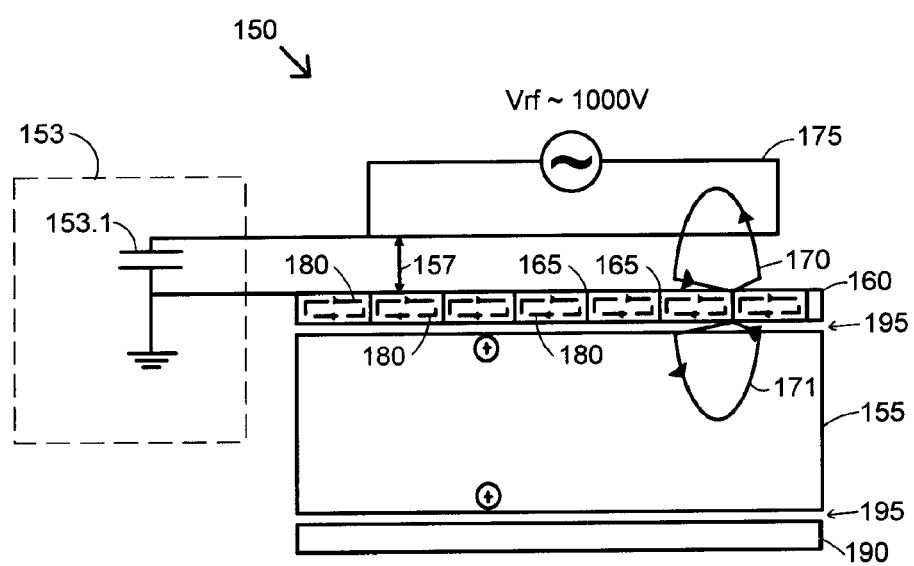
FIG. 4B shows an eddy current source plasma according to an embodiment of the present invention.

For a more detailed discussion of the plasma source and comparison with the standard technology, reference is now made to FIG. 4A and FIG. 4B, where there is shown a diagram of a conventional inductively coupled plasma (ICP) source 100 (FIG. 4A), as used in the standard technology, and an eddy current inductively coupled plasma source 150 (FIG. 4B) for embodiments of the present invention, respectively. In the ICP 100 (FIG. 4A), the energy is inductively coupled directly to a plasma 105 by an RF magnetic field, $B_{rf}$, 110 generated by an antenna 115. The antenna 115 is separated from the plasma 105 by an insulating dielectric wall 120 and is typically in air. $B_{rf}$ 110 passes directly through wall 120 and couples directly to the plasma 105, imparting power by inducing internal plasma currents. Although the ICP 100 is designed for inductive coupling, this design also results in unintentional capacitive coupling. The capacitive coupling is a result of the large RF electric field, $E_{rf}$, 112 between the antenna 115, which necessarily has very high voltage potentials of hundreds to thousands of volts, and the rest of the system.

FIG. 4A illustrates an equivalent circuit 123 where there is a capacitance, $C_1$, 123.1 between the antenna 115 and the interior of the dielectric wall 120, another capacitance, $C_{sheath,1}$, 123.2 associated with plasma sheaths 121 between the interior of the dielectric wall 120 and the plasma 105, and further capacitances, $C_{sheath,n}$, 123.3 associated with the plasma sheaths 121 between the plasma body and all other surfaces such as the vacuum chamber walls and the substrate 125 and corresponding electric fields $E_{rf\,sheath\,1}$ 112.1 and $E_{rf\,sheath\,n}$ 112.2. These capacitances are connected, and the antenna 115 induces capacitance currents, $I_{rf}$, 123.4 which will travel through these capacitances, and impart energy to the plasma 105 near the plasma sheaths 121. Because of the rectifying characteristic of plasma sheaths 121, the establishment of $I_{rf}$ 123.4 through the sheaths 121 causes significant voltage drops to occur, which in turn also result in significant increases in ion bombardment energy and flux at the surfaces which are in contact with the plasma 105. In a typical system, the resulting sheath voltages and ion energies are increased by ~50 volts to 100 volts by these RF capacitance currents.

By contrast, the eddy current source 150 (FIG. 4B) has no capacitive coupling to a plasma 155. This is illustrated in FIG. 4B by an equivalent circuit 153 having a capacitor, $C_1$, 153.1. In the eddy current source 150, the dielectric wall is replaced with a metal wall 160, which is broken up into conductive segments by placing insulating breaks 165 through its thickness (FIG. 4B). In this case, a magnetic field 170 from an antenna 175 induces eddy currents 180 which circulate within each metal segment. The eddy-currents 180 circulate continuously from the antenna-side to the plasma-side of the wall 160, and the current pattern on each side is effectively an inverted image of the other. The eddy currents 180 act to repel the magnetic fields 170, and force them through the narrow insulating breaks 165. The sum of the eddy currents on the plasma-side of the wall act together to reconstitute magnetic fields $B_{rf}$ 171 and the entire effect is for $B_{rf}$ 170 to still couple to the plasma 155 in the same manner as in the conventional ICP source. However, unlike the conventional ICP, there is no capacitive coupling to the plasma 155. This is because the metallic segments are all connected at their ends and grounded, and $E_{rf}$ 157 is prevented from passing through the wall 160 (the Faraday cage effect). Although there is still ion bombardment from the plasma 155 to surfaces 190, the ion energy is now reduced to the natural floating potential of sheaths 195 which is typically ~10 volts.

Another important attribute of the eddy current source is related to the power loss that occurs due to a plasma sheath.

This is represented in the power loss equation for plasma operating in the typical regimes for PECVD:

$$P_{loss} = q n_e U_{Bohm} A (2kT_e + E_{sheath} + E_{bulk})$$

Where:
- $P_{loss}$ is the power loss of the plasma
- q is the electron charge
- $n_e$ is the plasma (or charge) density
- $U_{Bohm}$ is the Bohm velocity
- A is the loss area, or surface in contact with the plasma
- $2kT_e$ is the energy carried by electrons to the boundary
- $E_{sheath}$ is the energy carried by ions to the boundary
- $E_{bulk}$ is the energy lost per charge pair in the bulk of the plasma The second term in parenthesis is attributed to the ion bombardment induced by capacitive coupling. In conventional ICP systems, this term can account for up to 50% of the energy loss, sometimes more, and results in heating of the surfaces in the system. The eddy current source eliminates this loss by eliminating the capacitive coupling, resulting in higher power coupling efficiencies and higher plasma densities for the same input power.

The eddy current source is a purely inductively coupled source with no capacitive coupling component. The eddy current source also has reduced heating of surfaces exposed to the plasma, including the substrate, and reduced sputtering of impurities from chamber walls.

Silicon Deposition

Working in a linear configuration, the overall gas flow will depend on the length of the plasma source. The experimental results presented here were obtained using plasma sources 10 cm wide and from 48 to 120 cm long. For these plasma sources, the expected range of suitable process conditions for deposition of microcrystalline silicon according some embodiments of the present invention include, but are not limited to, the following:

Pressure of 0.5 to 50 mTorr;
Temperature of substrate 80 to 250 degrees Celsius;
Silane Flow about 0.5 to 3 sccm per cm of the plasma source length and
preferably 0.5 to 1 sccm per cm of the plasma source length;
Hydrogen Flow of 0 to 5 sccm per cm of the plasma source length;
Argon flow of 0 to 5 sccm per cm of the plasma source length; and
RF Power of 20 to 60 Watts per cm of the plasma source length.

Figure 5:
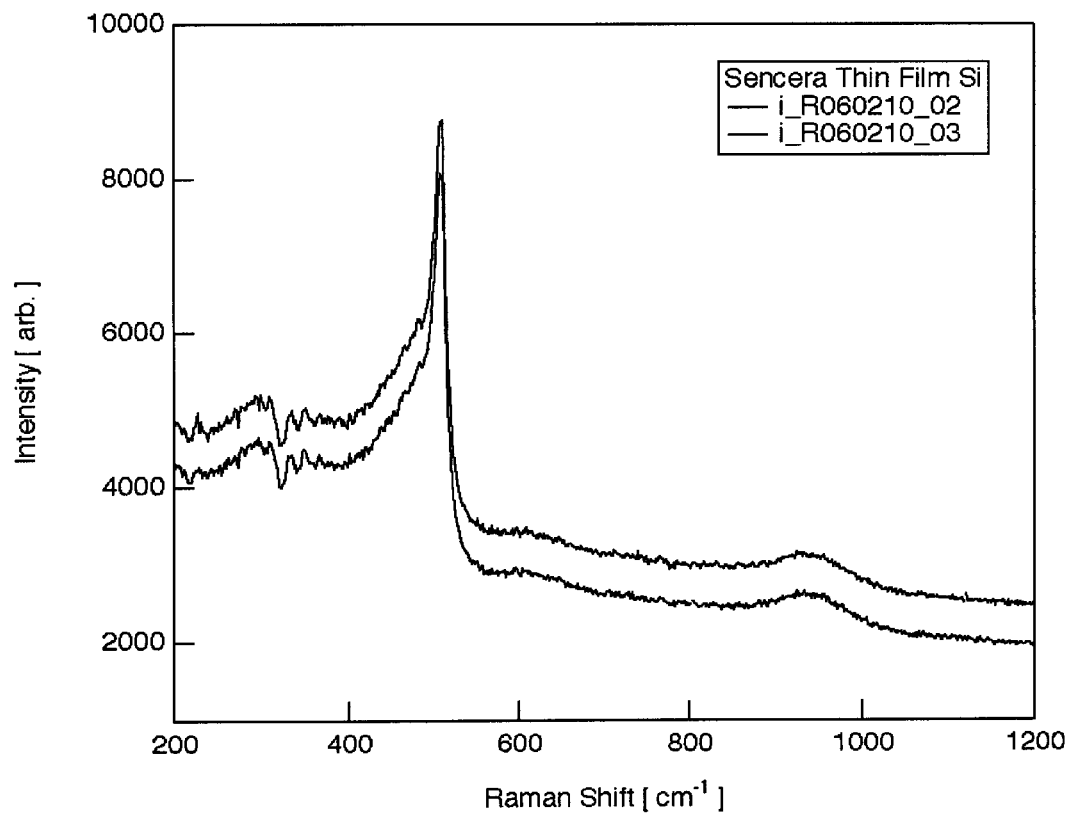
FIG. 5 shows Raman spectra for a silicon film according to an embodiment of the present invention.

Experimental data obtained using one embodiment of the present invention shows that microcrystalline silicon was deposited at low temperature with unexpectedly high deposition rates. FIG. 5 shows two Raman spectra scans of silicon deposited according to an embodiment of the present invention at a deposition rate of 60 Å/second without heating the substrate except by the plasma. The Raman scans were measured by the National Renewable Energy Laboratory in Colorado. The measurements shown in FIG. 5 are for a silicon film deposited using a deposition system that is essentially the same as that described in FIG. 1, FIG. 2, and FIG. 3. The plasma source used to deposit the film had a length of 120 cm and a width of 10 cm. The deposition was done at 5 mTorr process pressure and 5 kW radio frequency power. The substrate was glass; the substrate was translated beneath the plasma source multiple times to produce a total film thickness of about 0.2 micrometer. The translating speed of the substrate was 5 mm/sec. The gas flow was pure silane at a rate of 55 standard cubic centimeters per minute; the silane was input to the system between the substrate and the plasma source.

The Raman spectroscopy methods for analyzing the deposited silicon films were done using standard techniques and equipment for such measurements. Raman spectroscopy is a well-established process; as such, details of the measurements will not be presented here. The Raman spectra in FIG. 5 show a desired mixture of crystalline and amorphous phases. More specifically, FIG. 5 shows a mixed Raman signal including a crystalline peak at 520 $cm^{-1}$ and an amorphous band around 480 $cm^{-1}$ as expected for microcrystalline-Si optimized for solar cell devices. Conditions which lead to such mixed-phase material are typically close to yielding device grade amorphous silicon as well.

Figure 6:
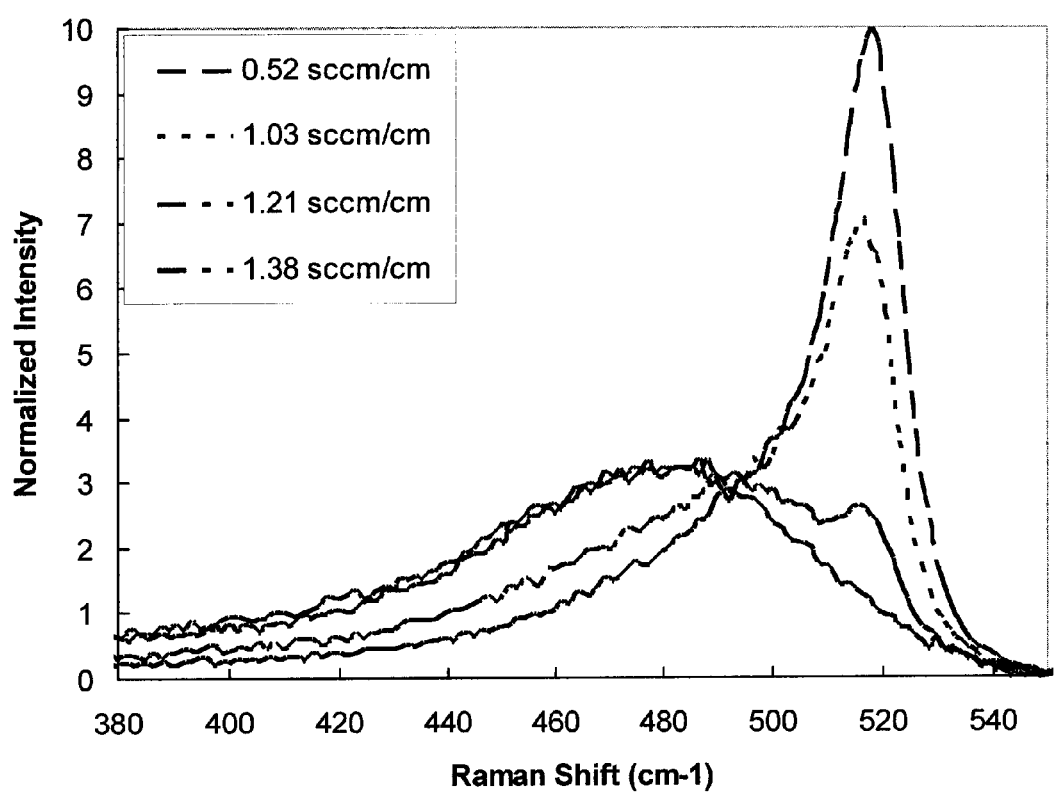
FIG. 6 shows Raman spectra for silicon films according to embodiments of the present invention.

Reference is now made to FIG. 6 where there is shown Raman spectra for silicon films deposited according to embodiments of the present invention. Spectra for four silicon films are shown. The silicon films were deposited using an apparatus substantially the same as that described in FIG. 1, FIG. 2, and FIG. 3. The plasma source had a length of 58 cm and a width 10 cm. The substrates were glass held at a temperature of about 200 degrees C. The substrate was moved beneath the plasma source multiple times at a rate of 2.5 mm per second in order to produce a total film thickness of about 1 micrometer. The process pressure was five milliTorr and the radio frequency power was 3 kW. The process gas was pure silane provided to the process chamber at a position between the substrate and the plasma source. The flow rate of silane for each of the four films were 0.52 sccm/cm length of plasma source (total of 30 sccms), 1.03 sccm/cm length of plasma source (total of 60 sccms), 1.21 sccm/cm length of plasma source (total of 70 sccms), and 1.38 sccm/cm length of plasma source (total of 80 sccms) which provided deposition rates of 18 Å (1.8 nm) per second, 35 Å (3.5 nm) per second, 42 Å (4.2 nm) per second, and 54 Å (5.4 nm) per second, respectively.

FIG. 6 shows how the crystallinity of the films can be controlled by adjusting the flow rate of silane. The amount of crystalline content for each of the films is indicated by the relative intensities of the crystalline peak that occurs between about 510 and 520 $cm^{-1}$. The highest intensities correlate with the highest amount of crystalline content. For the process conditions used for the films represented in FIG. 6, the crystalline content is inversely proportional to the flow rate of silane. In other words, the lower flow rates of silane produce the films having the highest crystalline content.

As an option for some embodiments of the present invention for depositing silicon, a gas input arrangement is used wherein argon and/or hydrogen are introduced so that they pass through the plasma source before reaching the substrate. Silane is fed into the chamber near the substrate at a position between the plasma source and the substrate. Furthermore, the experimental results presented here for the deposition of silicon used silane ($SiH_4$) as the silicon source. However, it should be understood that embodiments of the present invention are not limited to the use of silane as the silicon source. Some additional silicon sources that are suitable for embodiments of the present invention include, but are not limited to, disilane, trichlorosilane, and silicon tetrachloride.

Zinc Oxide Deposition

According to another embodiment of the present invention, thin films of zinc oxide were deposited for use as a transparent electrical conductor. For deposition of oxides, oxygen was introduced so that it passed through the plasma source. As and option, argon or other gases could be added with the oxygen. For zinc oxide deposition, a zinc compound was fed into the chamber near the substrate at a position between the plasma source and the substrate. The zinc oxide was grown as a transparent electrically conductive oxide with no substrate heating applied. This was done using a plasma source that was 120 cm long and 10 cm wide, essentially as described supra, and process conditions including but not limited to:
  Oxygen Flow of 14 sccm to 193 sccm
  Diethyl Zinc Flow of 20 sccm to 77 sccm
  Process Pressure of 2-8 mTorr
  RF Power of 3 kW; and
  Translating Substrate Speed of 0 or 3 mm per second. The depositions were done without a heat source other than the plasma. These process conditions resulted in deposition rates of from about 450 to about 2700 Åm/min on glass substrates. The films had optical transmission measurements typically greater than about 90% transmission and maximum values as high as about 98%. The sheet resistance for some of the more conductive films was typically in the range from about 50-100 ohms/square.

Figure 7:
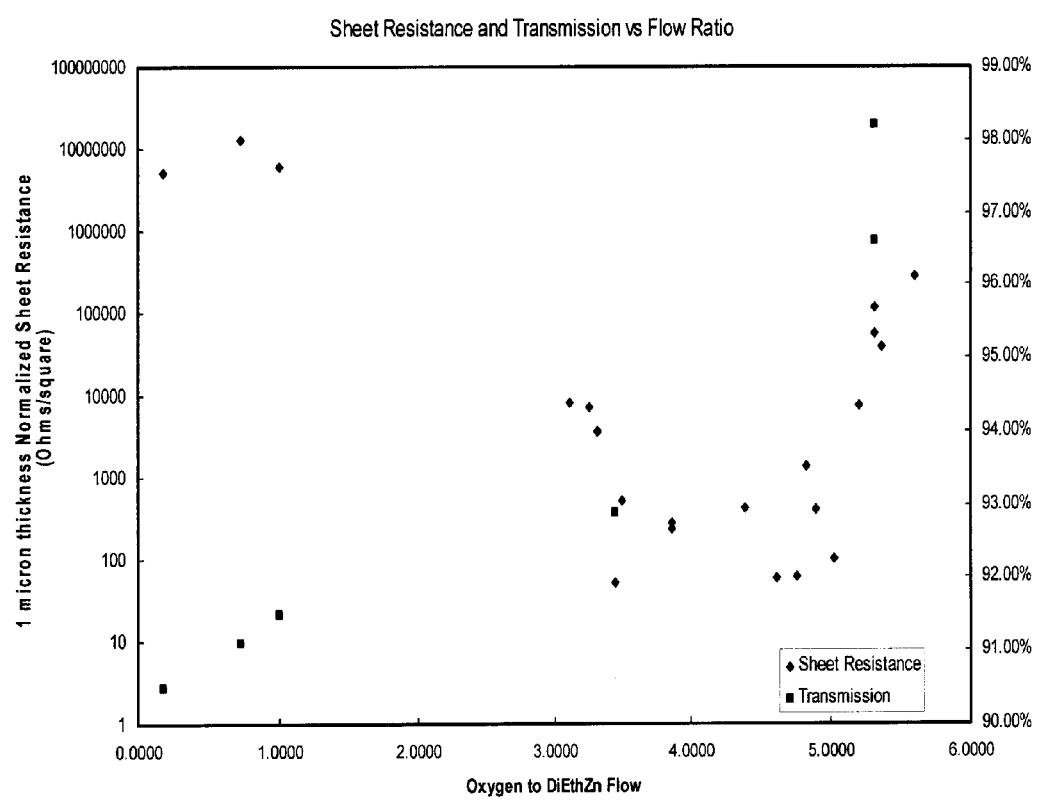
FIG. 7 shows process conditions and results for zinc oxide films according to embodiments of the present invention.

Additional information showing correlations between process conditions and resulting film properties for zinc oxide films according to embodiments of the present invention are summarized in FIG. 7. More specifically, FIG. 7 shows a graph of sheet resistance in ohms/square (normalized for a 1 micrometer thickness) and optical transmission as functions of the ratio of oxygen flow rate to diethyl zinc flow rate.

A preferred embodiment of the present invention uses deposition equipment substantially the same as that described in FIG. 1, FIG. 2, and FIG. 3 with the process conditions that include, but are not limited to:
  Oxygen Flow of 193 sccm;
  Diethyl Zinc Flow of 56 sccm;
  Process Pressure of 2.3 mTorr;
  RF Power of 3 kW; and
  Translating Substrate Speed of 3 mm per second.
For those process conditions the deposition rate was 1833 Åm/min, optical transmission was 92.9%, and the film sheet resistance was 52 ohms/square.

These films had good carrier mobility. A measured electron mobility of about 17 $cm^2$/V-sec has been verified for one or more of the films by Hall measurements, indicating a good film quality and a crystalline content for the film.

Figure 8:
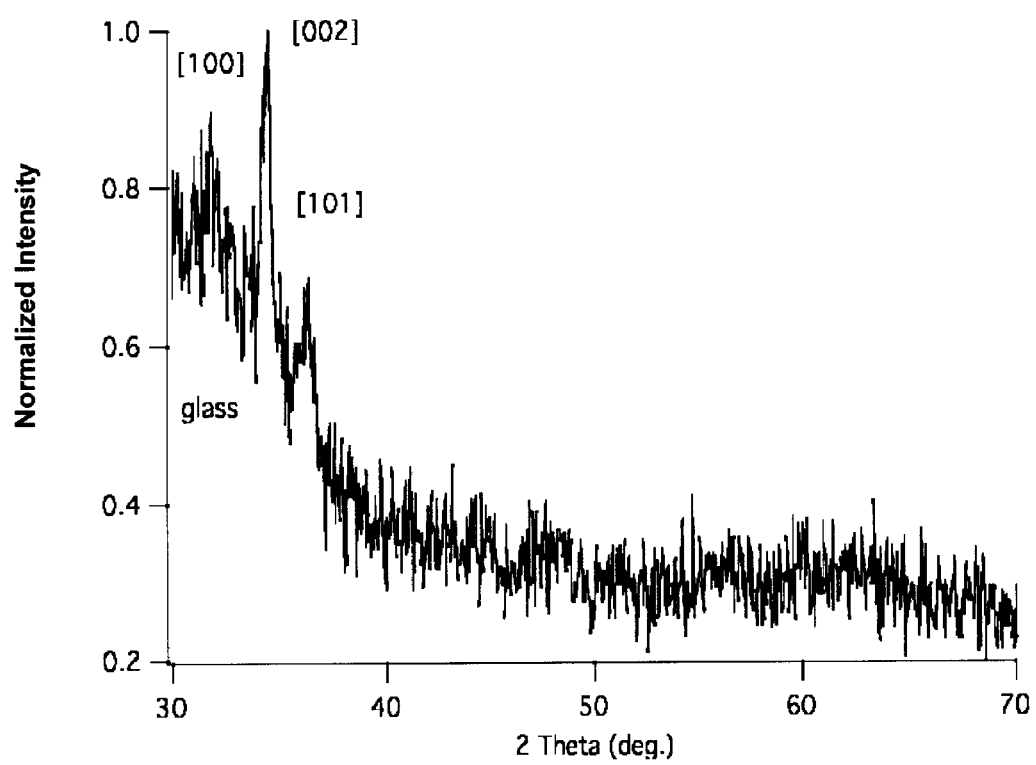
FIG. 8 shows x-ray diffraction measurements for a zinc oxide film according to embodiments of the present invention.

Additional evidence of the crystalline content for the zinc oxide films have been observed in x-ray diffraction measurements of the films. Reference is now made to FIG. 8 where there is shown an x-ray diffraction scan for a zinc oxide film deposited onto a glass substrate. The film clearly has crystalline content and a preferential [002] orientation that is desirable for transparent conductor applications.

Iron Oxide Deposition

Another embodiment of the present invention includes the deposition of iron oxide films for applications such as magnetic devices and such as photoelectrochemical water splitting. For deposition of oxides, argon and/or oxygen were introduced so that they passed through the plasma source. For iron oxide deposition, an iron compound was fed into the chamber near the substrate at a position between the plasma source and the substrate. The process conditions for obtaining these results include, but are not limited to:
  Oxygen Flow of 200-500 sccm;
  Iron Pentacarbonyl Flow of 20-40 sccm;
  Process Pressure of 3-5 mTorr;
  RF Power of 3 kW;
  Substrate Temperature of 45-100 degrees Celsius and higher; and
  Translating Substrate Speed of 3-5 mm per second.
The properties of the iron oxide films were examined by x-ray diffraction and were found to contain crystalline content for the alpha hematite state of iron oxide.

Some of the experimental results presented here use argon as one of the process gases. It is to be understood that embodiments of the present invention are not to be limited to the use of argon; other gases with similar properties to those of argon may be used. As one example, helium could also be introduced for some embodiments of the present invention. It should also be understood that for the examples presented above for the deposition of zinc oxide and iron oxide used to diethyl zinc and iron pentacarbonyl, respectively, but embodiments of the present invention are not restricted to using those compounds. More specifically, other compounds of zinc and other compounds of iron can be used for the deposition of zinc oxides and iron oxides according to embodiments of the present invention.

Figure 9:
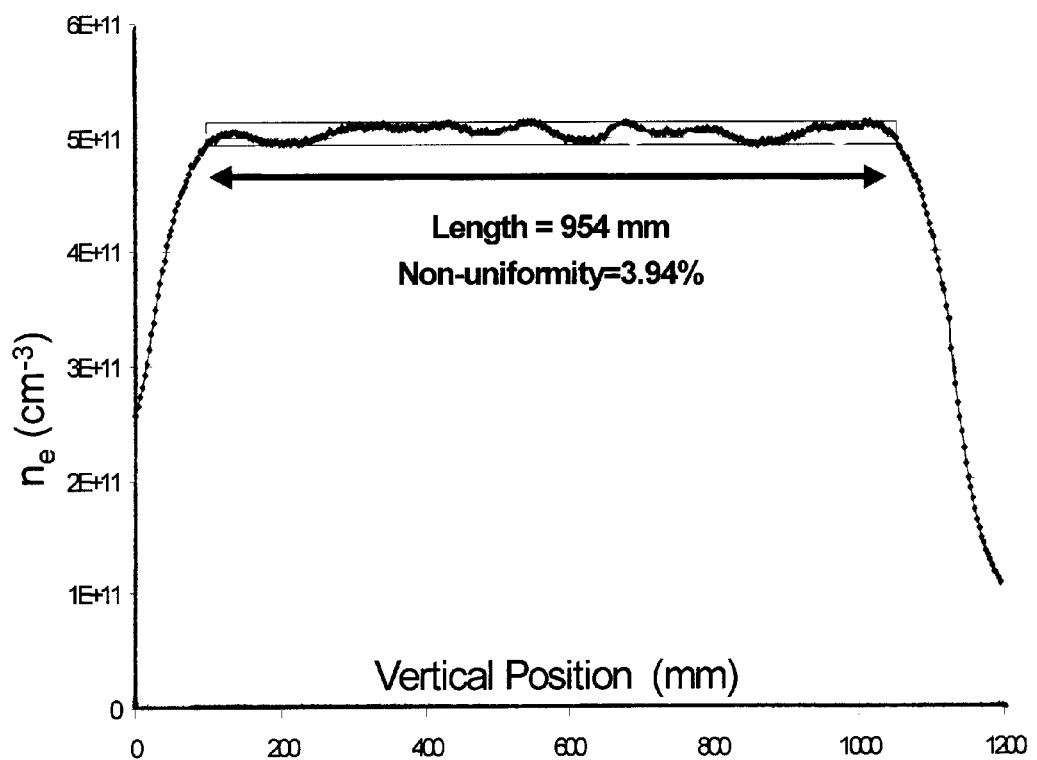
FIG. 9 shows plasma density non-uniformity for an embodiment of the present invention.

According to one embodiment of the present invention, the plasma source is a long linear source. One of the experimental versions of the source was built having a length of 1.2 meters and a width of 0.1 meter. The source was capable of producing a high-density plasma over a large area. A plasma source according to an embodiment of the present invention was tested on a high vacuum chamber with a variety of gas pressures and powers. A Langmuir probe was used to map the plasma characteristics. A plasma density map for the source is shown in FIG. 9. As shown, the source can achieve high density plasmas ($\sim 5\times 10^{11}$ $cm^{-3}$) at low pressures (0.90 mTorr), uniformly (<4% min-max) over a large length (~950 mm). Efforts using standard plasma technology to achieve such low non-uniformity over large areas or lengths for these high-density, low-pressure conditions have proven too difficult for commercialization.

As another option for embodiments of the present invention, one or more magnetic fields may be provided at one or more locations near the plasma chamber and/or near the substrate. The one or more magnetic fields may be generated with a permanent magnet, an electromagnet, or combinations of permanent magnets and electromagnets. The placement and magnitude of the magnetic field can be used to alter the plasma in ways such as to adjust the uniformity of the plasma, adjust the shape of the plasma, and improve the power coupling to the plasma.

Additional preferred embodiments of the present invention include but are not limited to:
1. A method of fabricating devices having a material with crystalline content, the method is performed using an eddy current inductively coupled linear plasma source having a width and a length. The length being substantially greater than the width. The plasma source having a) a substantially conductive body comprising one or more conductive segments interrupted by at least one dielectric break; b) a current carrier adjacent to the substantially conductive body; c) a power supply that furnishes alternating current power to the current carrier, the current carrier inducing eddy currents within the one or more conductive segments; d) a process chamber attached to the conductive body so as to allow transport of chemical species from the conductive body to the process chamber. The method comprising providing one or more reactive gases to the process chamber; generating a pure inductively coupled plasma with the plasma source, the eddy currents coupling power into the plasma adjacent to the substantially conductive body; and translating a substrate beneath the plasma source using process conditions for producing the material with crystalline content.
2. The method of embodiment 1, further comprising flowing a gas through the plasma source.

3. The method of embodiment 1, wherein the materials with crystalline content comprise nanocrystalline silicon, microcrystalline silicon, or polycrystalline silicon.
4. The method of embodiment 1, wherein the material with crystalline content is deposited at a rate greater than 5 Å (0.5 nm) per second.
5. The method of embodiment 1, wherein the material with crystalline content comprises nanocrystalline silicon, microcrystalline silicon or polycrystalline silicon deposited at a rate greater than 5 Å (0.5 nm) per second.
6. The method of embodiment 1, wherein the material with crystalline content comprises nanocrystalline silicon, microcrystalline silicon, or polycrystalline silicon deposited at a rate greater than 10 Å (1 nm) per second.
7. The method of embodiment 1, wherein the material with crystalline content comprises nanocrystalline silicon, microcrystalline silicon, or polycrystalline silicon deposited at a rate greater than 20 Å (2 nm) per second.
8. The method of embodiment 1, wherein the material with crystalline content comprises nanocrystalline silicon, microcrystalline silicon, or polycrystalline silicon deposited at a rate in the range from about 5 Å (0.5 nm) per second to about 60 Å (6 nm) per second at temperatures less than about 100 degrees Celsius.
9. The method of embodiment 1, wherein the one or more reactive gases comprise silane.
10. The method of embodiment 1, wherein the one or more reactive gases comprise disilane or silicon tetrachloride.
11. The method of embodiment 1, wherein the material with crystalline content is deposited over a larger area by moving the substrate transverse to the length of the plasma source.
12. The method of embodiment 1, wherein the plasma source produces a plasma at gas pressures in the range of 0.5 to 10 mTorr.
13. The method of embodiment 1, wherein the plasma source has a length of 48 cm and a width of 10 cm and the process conditions include:
Pressure of 0.5 to 50 mTorr,
Temperature of the substrate less than 250 degrees Celsius,
Silane Flow of 0.5 to 3 sccm per centimeter of plasma source length,
Hydrogen Flow of 0 to 5 sccm per centimeter of plasma source length,
Argon flow of 0 to 5 sccm per centimeter of plasma source length, and
RF Power of 20 to 60 Watts per centimeter of plasma source length.
14. A silicon solar cell made by the method of embodiment 1.
15. A flat panel display made by the method of embodiment 1.
16. A silicon solar cell made by the method of embodiment 2.
17. A flat panel display made by the method of embodiment 2.
18. A silicon solar cell made by the method of embodiment 13.
19. A flat panel display made by the method of embodiment 13.
20. The method of embodiment 2, wherein the plasma source has a length of 120 cm and a width of 10 cm and the process conditions include:
Oxygen Flow of 193 sccm;
Diethyl Zinc Flow of 56 sccm;
Process Pressure of 2.3 mTorr;
RF Power of 3 kW; and
Translating Substrate Speed of 3 mm per second.

21. The method of embodiment 2, wherein the plasma source has a length of 48 cm and a width of 10 cm and the process conditions include:
Oxygen Flow of 200 500 sccm;
Iron Pentacarbonyl Flow of 20-40 sccm;
Process Pressure of 3-5 mTorr;
RF Power of 3 kW;
Substrate Temperature 45-100 degrees Celsius and higher; and
Translating Substrate Speed 3-5 mm per second.
22. An optoelectronic device made by the method of embodiment 1.
23. An electronic device made by the method of embodiment 1.
24. A method of fabricating devices having a material with crystalline content, the method comprising providing an eddy current inductively coupled linear plasma source having a width and a length, the length being greater than the width, the plasma source having a) a substantially conductive body comprising one or more conductive segments interrupted by at least one dielectric break; b) a current carrier adjacent to the substantially conductive body; c) a power supply that furnishes alternating current power to the current carrier, the current carrier inducing eddy currents within the one or more conductive segments; d) a process chamber attached to the conductive body so as to allow transport of chemical species from the conductive body to the process chamber; providing one or more reactive gases to the process chamber; generating a pure inductively coupled plasma with the plasma source, the eddy currents coupling power into the plasma adjacent to the substantially conductive body; and translating a substrate beneath the plasma source using process conditions for producing the material with crystalline content.
25. The method of embodiment 24, further comprising flowing a gas through the plasma source.
26. The method of embodiment 24, wherein the material with crystalline content comprises microcrystalline silicon or polycrystalline silicon.
27. The method of embodiment 24, wherein the material with crystalline content is deposited at a rate greater than 5 Å (0.5 nm) per second.
28. The method of embodiment 24, wherein the material with crystalline content comprises nanocrystalline silicon, microcrystalline silicon, or polycrystalline silicon deposited at a rate greater than 5 Å (0.5 nm) per second.
29. The method of embodiment 24, wherein the material with crystalline content comprises nanocrystalline silicon, microcrystalline silicon, or polycrystalline silicon deposited at a rate greater than 10 Å (1 nm) per second.
30. The method of embodiment 24, wherein the material with crystalline content comprises nanocrystalline silicon, microcrystalline silicon, or polycrystalline silicon deposited at a rate greater than 20 Å (2 nm) per second.
31. The method of embodiment 24, wherein the material with crystalline content comprises nanocrystalline silicon, microcrystalline silicon, or polycrystalline silicon deposited at a rate in the range from about 5 Å (0.5 nm) per second to about 60 Å (6 nm) per second at temperatures less than about 100 degrees Celsius.
32. The method of embodiment 24, wherein the one or more reactive gases comprise silane.

33. The method of embodiment 24, wherein the one or more reactive gases comprise disilane or silicon tetrachloride.

34. The method of embodiment 24, wherein the material with crystalline content is deposited over a larger area by moving the substrate transverse to the length of the plasma source.

35. The method of embodiment 24, wherein the plasma source produces a plasma at gas pressures in the range of 0.5 to 10 mTorr.

36. The method of embodiment 24, wherein the plasma source has a length of 48 cm and a width of 10 cm and the process conditions include:
Pressure of 0.5 to 50 mTorr,
Temperature of the substrate less than 250 degrees Celsius,
Silane Flow of 0.5 to 3 sccm per centimeter of plasma source length,
Hydrogen Flow of 0 to 5 sccm per centimeter of plasma source length,
Argon flow of 0 to 5 sccm per centimeter of plasma source length, and
RF Power of 20 to 60 Watts per centimeter of plasma source length.

37. A silicon solar cell made by the method of embodiment 24.

38. A flat panel display made by the method of embodiment 24.

39. A silicon solar cell made by the method of embodiment 25.

40. A flat panel display made by the method of embodiment 25.

41. A silicon solar cell made by the method of embodiment 36.

42. A flat panel display made by the method of embodiment 36.

43. The method of embodiment 25, wherein the plasma source has a length of 48 cm and a width of 10 cm and the process conditions include:
Oxygen Flow of 193 sccm;
Diethyl Zinc Flow of 56 sccm;
Process Pressure of 2.3 mTorr;
RF Power of 3 kW; and
Translating Substrate Speed of 3 mm per second.

44. The method of embodiment 25, wherein the plasma source has a length of 48 cm and a width of 10 cm and the process conditions include:
Oxygen Flow of 200-500 sccm;
Iron Pentacarbonyl Flow of 20-40 sccm;
Process Pressure of 3-5 mTorr;
RF Power of 3 kW;
Substrate Temperature of 45-100 degrees Celsius and higher; and
Translating Substrate Speed of 3-5 mm per second.

45. An optoelectronic device made by the method of embodiment 24.

46. An electronic device made by the method of embodiment 24.

47. A method of fabricating solar cell devices or flat panel display devices having nanocrystalline silicon, microcrystalline silicon, or polycrystalline silicon. The method comprises providing an eddy current inductively coupled linear plasma source having a width and a length, the length being greater than the width; the plasma source having a) a substantially conductive body comprising one or more conductive segments interrupted by at least one dielectric break; b) a current carrier adjacent to the substantially conductive body; c) a power supply that furnishes alternating current power to the current carrier, the current carrier inducing eddy currents within the one or more conductive segments; d) a process chamber attached to the conductive body so as to allow transport of chemical species from the conductive body to the process chamber. The method also includes providing a silane flow of 0.5 to 3 sccm per centimeter of plasma source length, a hydrogen flow of 0 to 5 sccm per centimeter of plasma source length, and an argon flow of 0 to 5 sccm per centimeter of plasma source length to the process chamber. As an option, the method may also include flowing a gas through the plasma source. The method includes generating a pure inductively coupled plasma with the plasma source using the eddy currents to couple power into the plasma at a pressure 0.5 to 50 mTorr and RF power of 20 to 60 Watts per centimeter of plasma source length. In addition, the method includes translating a substrate at less than 250 degrees Celsius, more preferably less than 100 degrees Celsius for some substrate materials, beneath the plasma source so as to deposit the nanocrystalline silicon, the microcrystalline silicon, or the polycrystalline silicon at a rate greater than 5 Å (0.5 nm) per second.

In the foregoing specification, the invention has been described with reference to specific embodiments. However, a person of ordinary skill in the art appreciates that various modifications and changes can be made without departing from the scope of the present invention as set forth in the claims. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims.

As used herein, the terms "comprises," "comprising," "includes," "including," "has," "having," "at least one of," or any other variation thereof, are intended to cover a non-exclusive inclusion. For example, a process, method, article, or apparatus that comprises a list of elements is not necessarily limited only to those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Further, unless expressly stated to the contrary, "at least one of" is to be interpreted to mean "one or more." For example, a process, method, article, or apparatus that comprises one or more of a list of elements and if one or more of the elements comprises a sub-list of sub-elements, then the sub-elements are to be considered in the same manner as the elements. For example, at least one of A and B is satisfied by any one of the following: A is true (or present) and B is false (or not present), A is false (or not present) and B is true (or present), and both A and B are true (or present).

Furthermore, a process, method, article, or apparatus that comprises one or more of a list of elements and if one or more of the elements comprises a sub-list of sub-elements, then the "at least one" is to be interpreted to mean "one or more" of the elements and sub-elements where the elements and sub-elements are to be considered part of one group of equal members. For example, at least one of A and B, where A is a list of sub-elements a1, a2, and a3, is satisfied by any one of the following: any sub-element of A is true (or present) and B is false (or not present), any of or all of the sub-element(s) of A is false (or not present) and B is true (or present), and both any sub-element of A and B are true (or present). For example, at least one of A and B, where A is a list of sub-elements a1, a2, and a3 and B is a list of sub-elements b1, b2, and b3, is satisfied by any one of the following: any sub-element of A is true (or present) and any sub-element of B is false (or not present), any sub-element of A is false (or not present) and any sub-element of B is true (or present), and both any sub-element of A and any sub-element of B are true (or present).

What is claimed is:

1. A method of fabricating devices having a material with crystalline content, the method being performed using an eddy current inductively coupled linear plasma source having a width and a length, the length being substantially greater than the width; the plasma source having a) a substantially conductive body comprising one or more conductive segments interrupted by at least one dielectric break; b) a current carrier adjacent to the substantially conductive body; c) a power supply that furnishes alternating current power to the current carrier, the current carrier inducing eddy currents within the one or more conductive segments; d) a process chamber attached to the conductive body so as to allow transport of chemical species from the conductive body to the process chamber, the method comprising:
    providing one or more reactive gases to the process chamber;
    generating a pure inductively coupled plasma with the plasma source; and
    translating a substrate beneath the plasma source using process conditions for
    producing the material with crystalline content;
wherein the material with crystalline content is deposited at a rate greater than 5 Å (0.5 nm) per second.

2. The method of claim 1, further comprising flowing a gas through the plasma source.

3. The method of claim 1, wherein the materials with crystalline content comprise nanocrystalline silicon, microcrystalline silicon, or polycrystalline silicon.

4. The method of claim 1, wherein the material with crystalline content comprises nanocrystalline silicon, microcrystalline silicon, or polycrystalline silicon deposited at a rate greater than 10 Å (1 nm) per second.

5. The method of claim 1, wherein the material with crystalline content comprises nanocrystalline silicon, microcrystalline silicon, or polycrystalline silicon deposited at a rate greater than 20 Å (2 nm) per second.

6. The method of claim 1, wherein the material with crystalline content comprises nanocrystalline silicon, microcrystalline silicon, or polycrystalline silicon deposited at a rate in the range from 5 Å (0.5 nm) per second to about 60 Å (6 nm) per second at temperatures less than about 100 degrees Celsius.

7. The method of claim 1, wherein the one or more reactive gases comprise silane.

8. The method of claim 1, wherein the one or more reactive gases comprise disilane or silicon tetrachloride.

9. The method of claim 1, wherein the material with crystalline content is deposited over a larger area by moving the substrate transverse to the length of the plasma source.

10. The method of claim 1, wherein the plasma source produces a plasma at gas pressures in the range of 0.5 to 10 mTorr.

11. The method of claim 1, wherein the plasma source has a length of 48 cm and a width of 10 cm and the process conditions include:
    pressure of 0.5 to 50 mTorr,
    temperature of the substrate less than 250 degrees Celsius,
    silane flow of 0.5 to 3 sccm per centimeter of plasma source length,
    hydrogen flow of 0 to 5 sccm per centimeter of plasma source length,
    argon flow of 0 to 5 sccm per centimeter of plasma source length, and
    RF power of 20 to 60 watts per centimeter of plasma source length.

12. A method of fabricating devices having a material with crystalline content, the method comprising:
    providing an eddy current inductively coupled linear plasma source having a width and a length, the length being greater than the width; the plasma source having a) a substantially conductive body comprising one or more conductive segments interrupted by at least one dielectric break; b) a current carrier adjacent to the substantially conductive body; c) a power supply that furnishes alternating current power to the current carrier, the current carrier inducing eddy currents within the one or more conductive segments; d) a process chamber attached to the conductive body so as to allow transport of chemical species from the conductive body to the process chamber;
    providing one or more reactive gases to the process chamber;
    generating a pure inductively coupled plasma with the plasma source; and
    translating a substrate beneath the plasma source using process conditions for producing the material with crystalline content;
wherein the material with crystalline content is deposited at a rate greater than 5 Å (0.5 nm) per second.

13. The method of claim 12, wherein the material with crystalline content comprises nanocrystalline silicon, microcrystalline silicon, or polycrystalline silicon.

14. The method of claim 12, wherein the material with crystalline content comprises nanocrystalline silicon, microcrystalline silicon, or polycrystalline silicon deposited at a rate greater than 20 Å (2 nm) per second.

15. The method of claim 12, wherein the material with crystalline content comprises nanocrystalline silicon, microcrystalline silicon, or polycrystalline silicon deposited at a rate in the range from 5 Å (0.5 nm) per second to about 60 Å (6 nm) per second at temperatures less than about 100 degrees Celsius.

16. The method of claim 12, wherein the one or more reactive gases comprise disilane or silicon tetrachloride.

17. The method of claim 12, wherein the plasma source has a length of 48 cm and a width of 10 cm and the process conditions include:
    pressure of 0.5 to 50 mTorr,
    temperature of the substrate less than 250 degrees Celsius,
    silane flow of 0.5 to 3 sccm per centimeter of plasma source length,
    hydrogen flow of 0 to 5 sccm per centimeter of plasma source length,
    argon flow of 0 to 5 sccm per centimeter of plasma source length, and RF power of 20 to 60 Watts centimeter of plasma source length.

18. A method of fabricating solar cell devices or flat panel display devices having nanocrystalline silicon, microcrystalline silicon, or polycrystalline silicon, the method comprising:

providing an eddy current inductively coupled linear plasma source having a width and a length, the length being greater than the width; the plasma source having a) a substantially conductive body comprising one or more conductive segments interrupted by at least one dielectric break; b) a current carrier adjacent to the substantially conductive body; c) a power supply that furnishes alternating current power to the current carrier, the current carrier inducing eddy currents within the one or more conductive segments; d) a process chamber attached to the conductive body so as to allow transport of chemical species from the conductive body to the process chamber;

providing a silane flow of 0.5 to 3 sccm per centimeter of plasma source length, a hydrogen flow of 0 to 5 sccm per centimeter of plasma source length, and an argon flow of 0 to 5 sccm per centimeter of plasma source length to the process chamber;

flowing a gas through the plasma source;

generating a pure inductively coupled plasma with the plasma source using the eddy currents to couple power into the plasma at a pressure 0.5 to 50 mTorr and RF power of 20 to 60 Watts per centimeter of plasma source length; and translating a substrate at less than 250 degrees Celsius beneath the plasma source so as to deposit the nanocrystalline silicon, the microcrystalline silicon, or the polycrystalline silicon at a rate greater than 5 Å (0.5 nm) per second.

* * * * *